(12) United States Patent
Klekotka

(10) Patent No.: US 6,985,787 B2
(45) Date of Patent: Jan. 10, 2006

(54) METHOD AND APPARATUS FOR MONITORING PARTS IN A MATERIAL PROCESSING SYSTEM

(75) Inventor: James E. Klekotka, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/331,340

(22) Filed: Dec. 31, 2002

(65) Prior Publication Data

US 2004/0128014 A1 Jul. 1, 2004

(51) Int. Cl.
*G06F 19/00* (2006.01)
(52) U.S. Cl. .................. 700/121; 700/96; 700/115; 705/28
(58) Field of Classification Search ............. 700/108, 700/121, 122, 96, 115; 705/28
See application file for complete search history.

(56) References Cited

U.S. PATENT DOCUMENTS

| | | | | |
|---|---|---|---|---|
| 5,995,046 | A * | 11/1999 | Belcher et al. | 342/450 |
| 6,047,579 | A | 4/2000 | Schmitz | |
| 6,121,926 | A * | 9/2000 | Belcher et al. | 342/450 |
| 6,459,726 | B1 | 10/2002 | Ovard et al. | 375/219 |
| 6,618,640 | B1 * | 9/2003 | Hittner et al. | 700/116 |
| 6,693,432 | B2 * | 2/2004 | Kraz | 324/457 |
| 6,898,558 | B2 * | 5/2005 | Klekotka | 702/188 |
| 2002/0008621 | A1 * | 1/2002 | Barritz et al. | 340/572.1 |
| 2002/0014963 | A1 * | 2/2002 | Trosper | 340/571 |
| 2002/0080032 | A1 * | 6/2002 | Smith et al. | 340/572.1 |
| 2002/0087867 | A1 * | 7/2002 | Oberle et al. | 713/183 |
| 2003/0043027 | A1 * | 3/2003 | Carson et al. | 340/310.01 |
| 2003/0069648 | A1 * | 4/2003 | Douglas et al. | 700/2 |
| 2003/0130912 | A1 * | 7/2003 | Davis et al. | 705/28 |
| 2003/0233161 | A1 * | 12/2003 | Cheng et al. | 700/108 |
| 2004/0007326 | A1 * | 1/2004 | Roche et al. | 156/345.24 |
| 2004/0041714 | A1 * | 3/2004 | Forster | 340/870.17 |
| 2004/0126906 | A1 * | 7/2004 | Klekotka | 438/8 |
| 2004/0127030 | A1 * | 7/2004 | Klekotka | 438/689 |
| 2004/0127031 | A1 * | 7/2004 | Klekotka | 438/689 |
| 2004/0128021 | A1 * | 7/2004 | Klekotka | 700/204 |
| 2005/0067102 | A1 * | 3/2005 | Baldwin et al. | 156/345.24 |

FOREIGN PATENT DOCUMENTS

| | | |
|---|---|---|
| WO | WO 01/82009 A3 | 11/2001 |
| WO | WO 01/95242 A2 | 12/2001 |
| WO | WO 02/17030 A2 | 2/2002 |
| WO | WO 2004/059405 | 7/2004 |

OTHER PUBLICATIONS

U.S. Appl. No. 60/378,384.*

* cited by examiner

*Primary Examiner*—Paul Rodriguez
(74) *Attorney, Agent, or Firm*—Oblon, Spivak, McClelland, Maier & Neustadt, P.C.

(57) ABSTRACT

The present invention presents an improved apparatus and method for monitoring parts in a material processing system, wherein the material processing system includes a processing tool, a number of RF-responsive part identifiers coupled to the processing tool to generate and transmit part ID data, and a sensor interface assembly (SIA) configured to receive the part ID data from the plurality of RF-responsive part identifiers.

81 Claims, 12 Drawing Sheets

METHOD AND APPARATUS FOR MONITORING PARTS IN A MATERIAL PROCESSING SYSTEM

CROSS-REFERENCE TO RELATED APPLICATIONS

This application is related to co-pending applications 10/331,330, filed on even date herewith, entitled "Method and Apparatus for Monitoring a Material Processing System"; Ser. No. 10/331,332, filed on even date herewith, entitled "Method and Apparatus for Monitoring a Material Processing System"; Ser. No. 10/331,587, filed on even date herewith, entitled "Method and Apparatus for Monitoring a Material Processing System"; and Ser. No. 10/331,341, filed on even date herewith, entitled "Method and Apparatus for Monitoring a Plasma in a Material Processing System". The entire contents of each of these applications are herein incorporated by reference.

FIELD OF THE INVENTION

The present invention relates to monitoring a process in a processing system and, more particularly, to monitoring a process using a monitoring device having an integral transmission device.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

During, for example, an etch process, monitoring the plasma processing system can be very important when determining the state of a plasma processing system and determining the quality of devices being produced. Additional process data can be used to prevent erroneous conclusions regarding the state of the system and the state of the products being produced. For example, the continuous use of a plasma processing system can lead to a gradual degradation of the plasma processing performance and ultimately to complete failure of the system. Additional process related data and tool related data will improve the management of a part identifier system and the quality of the products being produced.

SUMMARY OF THE INVENTION

The present invention provides an apparatus and method for monitoring a process in a processing system and, more particularly, to a process monitoring device having an integral transmission device and a method for monitoring a process in a processing system using a process monitoring device having an integral transmission device.

The present invention provides an apparatus and method for monitoring a plasma process in a material processing system and, more particularly, to a plasma monitoring device having an integral transmission device and a method for monitoring a plasma process in a material processing system using a plasma monitoring device having an integral transmission device.

The present invention also provides a means for monitoring a process in a material processing system that includes at least one RF-responsive sensor coupled to at least one sensor interface assembly (SIA).

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention provides an improved material processing system that can include a processing tool, which can comprise one or more process chambers. In addition, the processing system can include a plurality of RF-responsive part identifiers that are coupled to the processing tool to generate and transmit part ID data and a sensor interface assembly (SIA) configured to receive the part ID data from at least one of the plurality of RF-responsive part identifiers.

Figure 1:
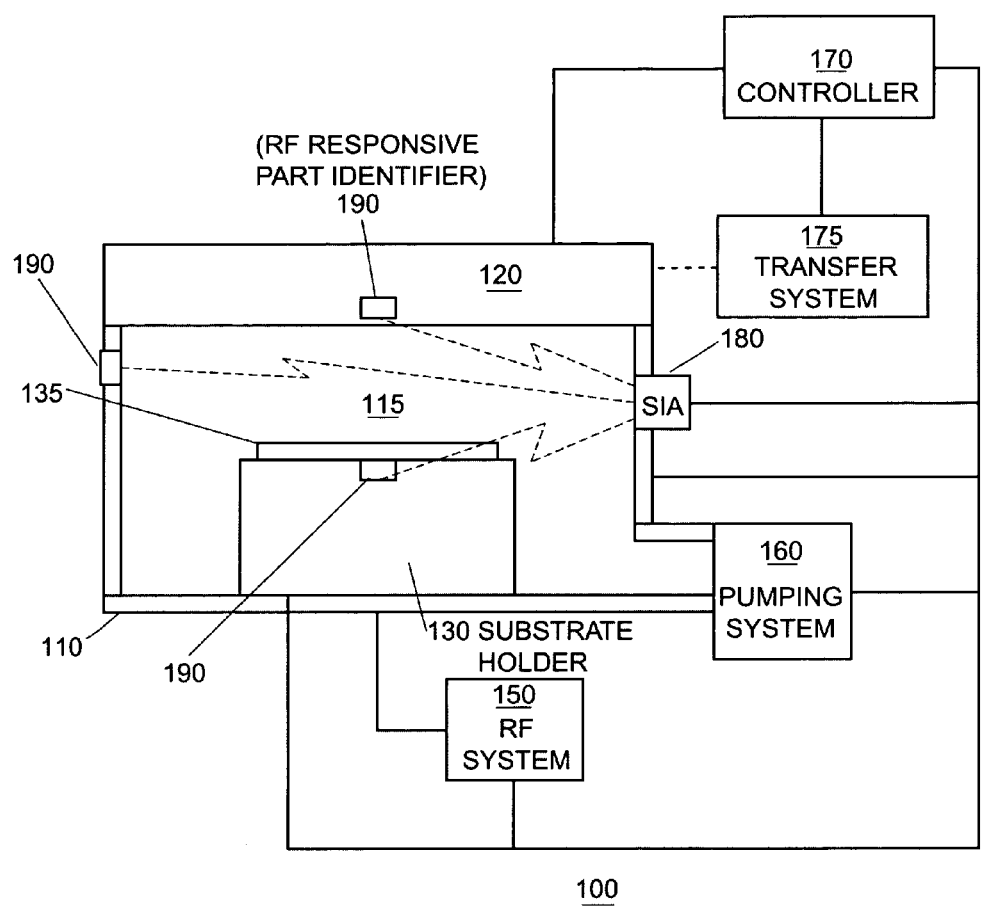
FIG. 1 illustrates a simplified block diagram for a material processing system in accordance with an embodiment of the present invention.

FIG. 1 illustrates a simplified block diagram for a material processing system in accordance with an embodiment of the present invention. For example, material processing system 100 can comprise an etch system, such as an plasma etcher. Alternately, material processing system 100 can comprise a photoresist coating system such as a photoresist spin coating system, and/or material processing system 100 can comprise a photoresist patterning system such as a lithography system. In another embodiment, material processing system 100 can comprise a dielectric coating system such as a spin-on-glass (SOG) or spin-on-dielectric (SOD) system. In another embodiment, material processing system 100 can comprise a deposition chamber such as a chemical vapor deposition (CVD) system, a physical vapor deposition (PVD) system, a atomic layer deposition (ALD) system, and/or combinations thereof. In an additional embodiment, material processing system 100 can comprise a thermal processing system such as a rapid thermal processing (RTP) system. In another embodiment, material processing system 100 can comprises a batch diffusion furnace or other semiconductor processing system.

In the illustrated embodiment, material processing system 100 comprises processing chamber 110, upper assembly 120, substrate holder 130 for supporting substrate 135, pumping system 160, and controller 170. For example, pumping system 160 can work as part of an exhaust system. The exhaust system is well known for one of ordinary skill in the art and schematically represented by pumping system 160. For example, processing chamber 110 can facilitate the formation of a processing gas in a process space 115 adjacent substrate 135. The material processing system 100 can be configured to process 200 mm substrates, 300 mm substrates, or larger substrates. Alternately, the material processing system can operate by generating plasma in one or more processing chambers.

Substrate 135 can be, for example, transferred into and out of processing chamber 110 through a slot valve and chamber feed-through via robotic substrate transfer system where it can be received by substrate lift pins housed within substrate holder 130 and mechanically translated by devices housed therein. The transfer system is well known to one of ordinary skill in the art and schematically represented by transfer system 175 in FIG. 1. Once substrate 135 is received from substrate transfer system 175, it can be lowered to an upper surface of substrate holder 130.

Substrate 135 can be, for example, affixed to the substrate holder 130 via an electrostatic clamping system. Furthermore, substrate holder 130 can further include a cooling system including a re-circulating coolant flow that receives heat from substrate holder 130 and transfers heat to a heat exchanger system (not shown), or when heating, transfers heat from the heat exchanger system. Moreover, gas can, for example, be delivered to the backside of substrate 135 via a backside gas system to improve the gas-gap thermal conductance between substrate 135 and substrate holder 130. Such a system can be utilized when temperature control of the substrate is required at elevated or reduced temperatures. In other embodiments, heating elements, such as resistive heating elements, or thermoelectric heaters/coolers can be included.

In alternate embodiments, substrate holder 130 can, for example, further comprise a vertical translation device that can be surrounded by a bellows coupled to the substrate holder 130 and the processing chamber 110, and configured to seal the vertical translation device from the reduced pressure atmosphere in processing chamber 110. Additionally, a bellows shield can, for example, be coupled to the substrate holder 130 and configured to protect the bellows. Substrate holder 130 can, for example, further provide a focus ring a shield ring, and a baffle plate which are schematically represented by the substrate holder 130 and well known to one of ordinary skill in the art.

In the illustrated embodiment, shown in FIG. 1, substrate holder 130 can comprise an electrode through which RF power can be coupled to the process gasses in process space 115. For example, substrate holder 130 can be electrically biased at a RF voltage via the transmission of RF power from RF system 150. In some cases, a RF bias can be used to heat electrons to form and maintain plasma. A typical frequency for the RF bias can range from 1 MHz to 100 MHz. For example, semiconductor processing systems that use 13.56 MHz for plasma processing are well known to those skilled in the art. These features of a substrate holder are well known to one of ordinary skill in the art and schematically represented by the substrate holder 130.

As shown in FIG. 1, upper assembly 120 can be coupled to the processing chamber 110 and configured to perform at least one of the following functions: provide a gas injection system, provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, provide a Helicon wave plasma source, and provide a surface wave plasma source.

For example, upper assembly 120 can comprise an electrode, an insulator ring, an antenna, a transmission line, and/or other RF components which are schematically represented by the upper assembly 120 and well known to one of ordinary skill in the art. In addition, upper assembly 120 can comprise permanent magnets, electromagnets, and/or other magnet system components. Also, upper assembly 120 can comprise supply lines, injection devices, and/or other gas supply system components. Furthermore, upper assembly 120 can comprise a housing, a cover, sealing devices, and/or other mechanical components. All of these features are also schematically represented by the upper assembly and well known to one of ordinary skill in the art.

In an alternate embodiment, processing chamber 110 can, for example, further comprise a chamber liner or process tube for protecting the processing chamber 110 from a processing plasma in the process space 115. In addition, processing chamber 110 can comprise a monitoring port. A monitoring port can, for example, permit optical monitoring of process space 115.

Material processing system 100 also comprises at least one measuring device having an integral transmission means. As shown in the illustrated embodiment, at least one RF-responsive part identifier 190 can be used to generate and transmit part ID data. For example, chamber 110 can comprise at least one RF-responsive part identifier 190, and/or upper assembly 120 can comprise at least one RF-responsive part identifier 190, and/or substrate holder can comprise at least one RF-responsive part identifier 190. Further, the RF-responsive part identifier may be coupled to a plate such as an exhaust plate, baffle plate, electrode plate or an insulator plate, which are well known to one of ordinary skill in the art and schematically represented by one of the chamber 110, upper assembly 120 and substrate holder 130 shown in FIG. 1.

Material processing system 100 also comprises at least one interface device having an integral reception means. As shown in FIG. 1, a sensor interface assembly (SIA) 180 can be used to communicate with at least one RF-responsive part identifier 190. For example, SIA 180 can receive the part ID data.

In one embodiment, RF-responsive part identifier 190 can comprise a part identifier (not shown) and an integral transmitter (not shown), and SIA 180 can comprise an integral receiver (not shown). RF-responsive part identifier 190 can use the transmitter to send data, and the SIA 180 can use the receiver to receive the transmitted data. RF-responsive part identifiers 190 can operate using the same or different frequencies, and SIA 180 can operate using one or more frequencies.

Material processing system 100 also comprises a controller 170. Controller 170 can be coupled to chamber 110, upper assembly 120, substrate holder 130, RF system 150, pumping system 160, and SIA 180. The controller can be configured to provide control data to the SIA and receive part ID data from the SIA. For example, controller 170 can comprise a microprocessor, a memory (e.g., volatile and/or nonvolatile memory), and a digital I/O port capable of generating control voltages sufficient to communicate and activate inputs to the processing system 100 as well as monitor outputs from the processing system 100. Moreover, the controller 170 can exchange information with chamber 110, upper assembly 120, substrate holder 130, RF system 150, pumping system 160, and SIA 180. Also, a program stored in the memory can be utilized to control the aforementioned components of a material processing system 100 according to a process recipe. In addition, controller 170 can be configured to analyze the part ID data, to compare the part ID data with target part ID data, and to use the comparison to change a process and/or control the processing tool. Also, the controller can be configured to analyze the part ID data, to compare the part ID data with historical part ID data, and to use the comparison to predict, prevent, and/or declare a fault.

Figure 2:
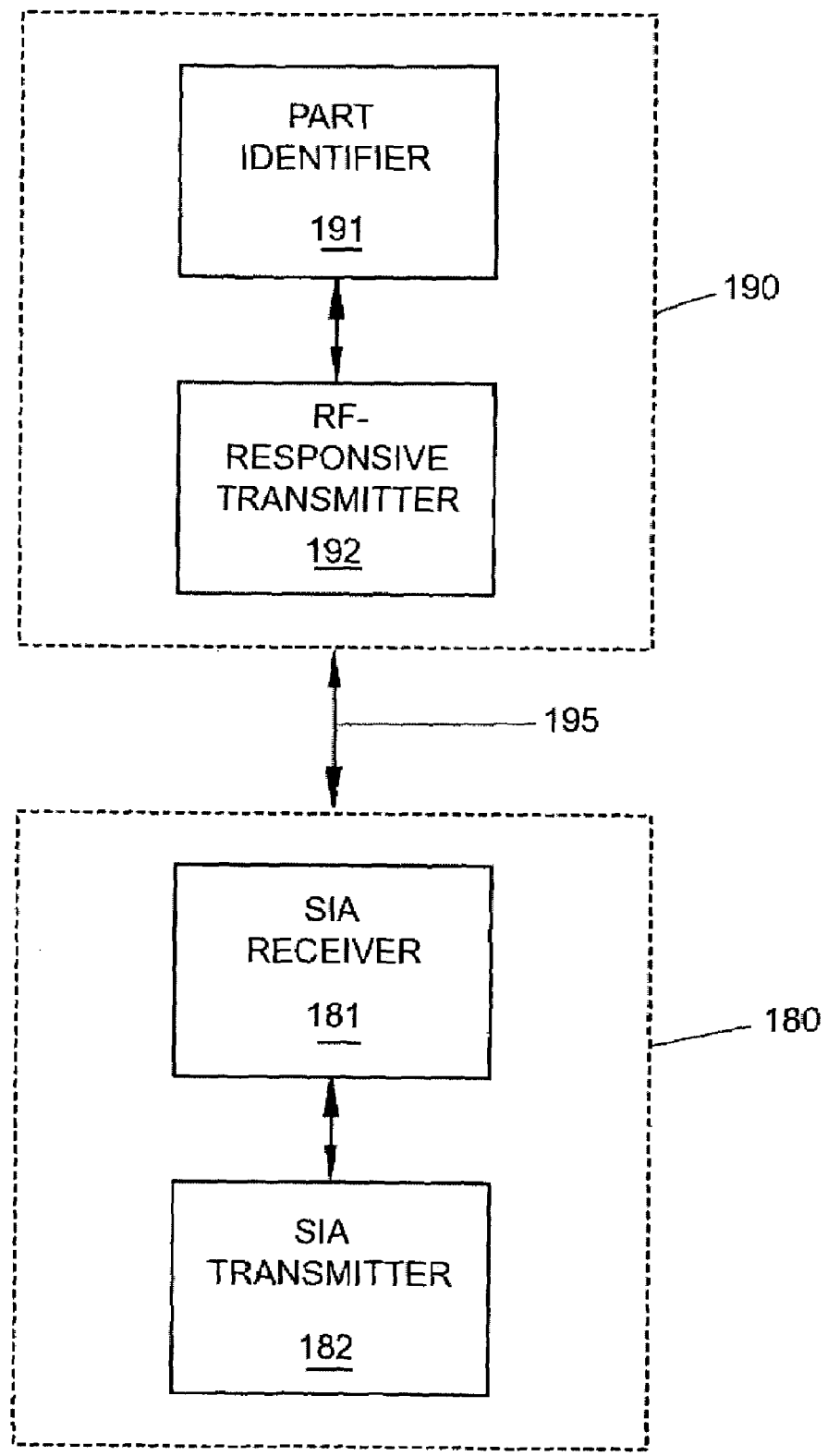
FIG. 2 shows a simplified block diagram of a RF-responsive part identifier and a sensor interface assembly (SIA) in accordance with an embodiment of the present invention.

FIG. 2 shows a simplified block diagram of a RF-responsive part identifier and a SIA in accordance with an embodiment of the present invention. In the illustrated embodiment, SIA 180 comprises SIA receiver 181 and SIA transmitter 182, and RF-responsive part identifier 190 comprises part identifier 191 and RF-responsive transmitter 192.

SIA 180 can be coupled to RF-responsive part identifier 190 using communications link 195. For example, RF-responsive part identifier 190 and SIA 180 can operate using one or more RF frequencies in the range from 0.1 MHz to 10.0 GHz. Alternately, communications link 195 can comprise optical means.

SIA receiver 181 can be configured to receive signals from one or more RF-responsive part identifiers. For example, SIA receiver 181 can be configured to receive a response signal from at least one RF-responsive part identifier, and the response signal can comprise data, which can include part ID data.

In addition, SIA transmitter 182 can be configured to transmit signals to one or more RF-responsive part identifiers. For example, SIA transmitter 182 can be configured to transmit an input signal to at least one RF-responsive part identifier, and the input signal can comprise data, which can include control data.

Part identifier 191 can be configured to provide one or more component related properties. For example, part identifier 191 can be configured to generate part ID data that can comprise at least one of part ID data, system ID data, manufacturing data, and use data and to provide the part ID data to a RF-responsive transmitter 192. Part ID data can comprise information such as a part number that can be used to verify that the proper part has been installed in the system. System ID data can comprise information such as chamber ID data and tool ID data that can be used to determine system configuration. Manufacturing data can comprise information such as the manufacturer and the date of manufacture that can be used to verify that a genuine part is being used. Use data can comprise information such as usage time and process data.

In various embodiments, part identifier 191 can comprise at least one of a memory, a processor, a timer, and a sensor. For example, memory can comprise at least one of read only, write only, and read/write memory, and static and/or dynamic RAM can be used. Processor can comprise at least one of read only, write only, and read/write memory, and can comprise the means to control the memory being used. Timer can comprise at least one of a continuously running timer and a triggered timer, and a triggered timer can be triggered by a process related or a non-process related frequency. For example, a timer can convert RF energy into a DC signal and use the DC signal to operate the timer. In this manner, RF hour data can be generated.

Alternately, part identifier 191 can further comprise at least one of a power source, a receiver, transmitter, controller, timer, memory (e.g., volatile and/or non-volatile memory), and a housing.

Part identifier 191 can be configured to generate part ID data for long periods of time or for short periods of time. For example, a status sensor can comprise at least one of a continuously running timer and a triggered timer, and a triggered timer can be triggered by a process related event or a non-process related event. A part identifier can convert RF energy into a DC signal and use the DC signal to operate. In this manner, process related data, such as RF hours data, can be generated.

RF-responsive transmitter 192 can be configured to transmit signals to at least one SIA 180. For example, RF-responsive transmitter 192 can be configured to transmit a response signal, and the response signal can comprise data, which can include part ID data. Also, the transmitter can be used to process and transmit narrowband and wideband signals including AM signals, FM signals, and/or PM signals. In addition, the transmitter can also process and transmit coded signals and/or spread spectrum signals to increase its performance within a high interference environment such as a semiconductor processing facility.

In various embodiments, RF-responsive transmitter 192 can comprise at least one of a power source, a signal source, a modulator, a coder, an amplifier, an antenna, a memory (e.g., volatile and/or non-volatile memory), a housing, and a controller. In one case, RF-responsive transmitter 192 can comprise an antenna (not shown) that is used as a backscattering device when placed within a RF field.

In alternate embodiments, RF-responsive part identifier 190 can further comprise at least one of a power source, signal source, receiver, antenna, memory (e.g., volatile and/or non-volatile memory), timer, housing, and controller. Also, RF-responsive part identifier 190 can further comprise sensors such as described in co-pending applications Ser. No. 10/331,330, filed on even date herewith, entitled "Method and Apparatus for Monitoring a Material Processing System"; Ser. No. 10/331,332, filed on even date herewith, entitled "Method and Apparatus for Monitoring a Material Processing System"; Ser. No. 10/331,587, filed on even date herewith, entitled "Method and Apparatus for Monitoring a Material Processing System"; and Ser. No. 10/331,341, filed on even date herewith, entitled "Method and Apparatus for Monitoring a Plasma in a Material Processing System", all of which are incorporated by reference herein.

Figure 3A:
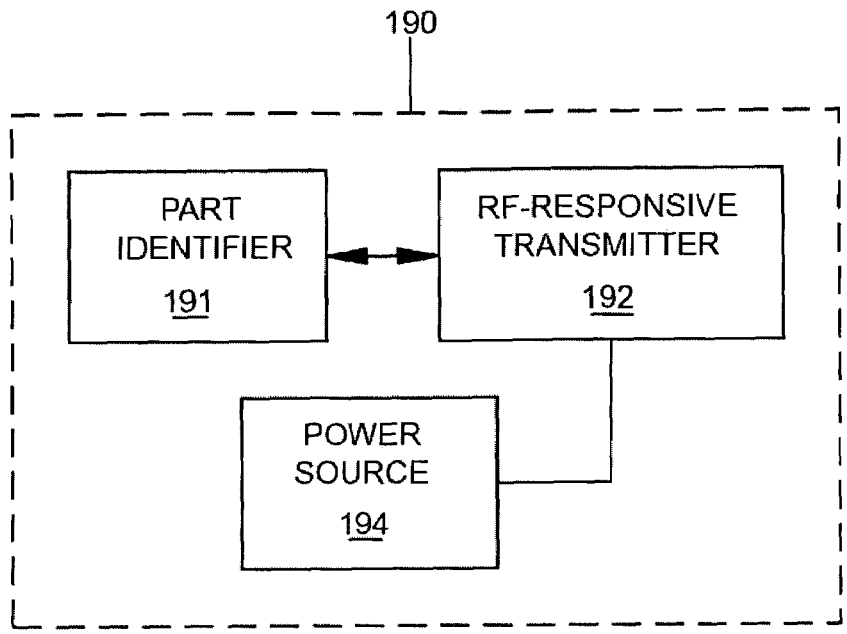
FIGS. 3a–3c show simplified block diagrams of a RF-responsive part identifier in accordance with embodiments of the present invention.
Figure 3B:
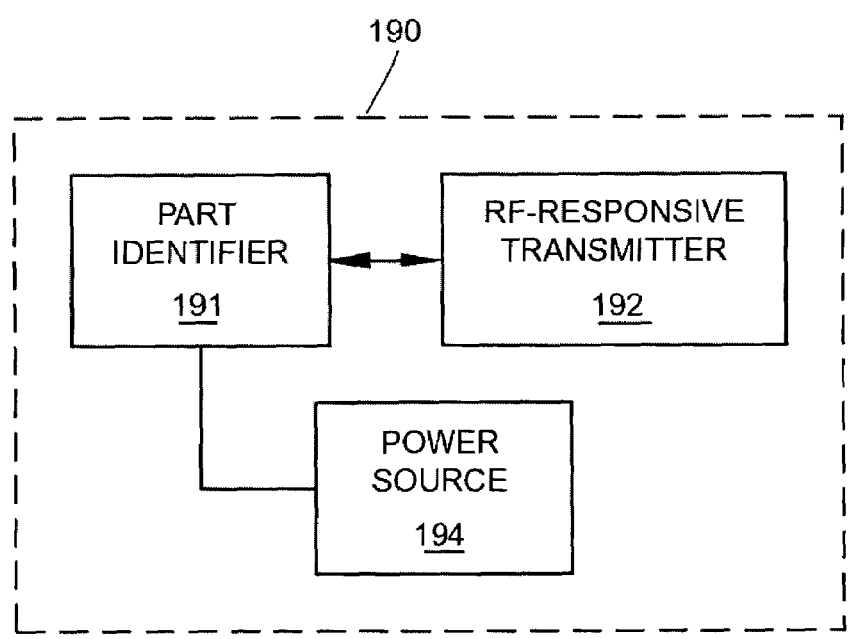
Figure 3C:
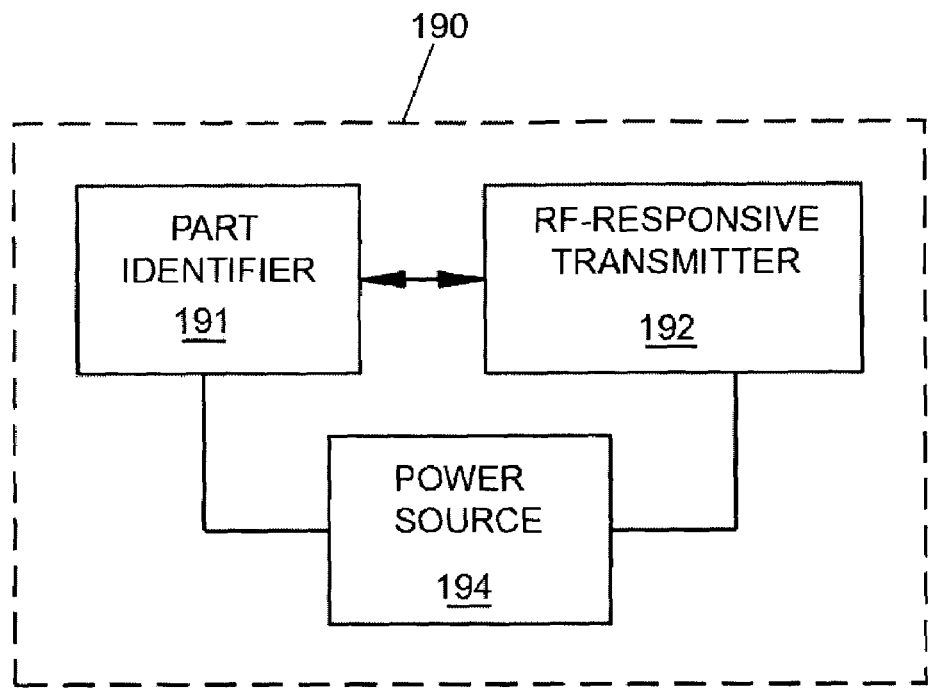

FIGS. 3a–3c show simplified block diagrams of a RF-responsive part identifier in accordance with embodiments of the present invention. In the illustrated embodiments, RF-responsive part identifier 190 comprises part identifier 191, RF-responsive transmitter 192, and power source 194.

As shown in FIG. 3a, power source 194 can be coupled to RF-responsive transmitter 192. Alternately, power source 194 can be incorporated within RF-responsive transmitter 192. As shown in FIG. 3b, power source 194 can be coupled to part identifier 191. Alternately, power source 194 can be incorporated within part identifier 191. As shown in FIG. 3c, power source 194 can be coupled to part identifier 191 and RF-responsive transmitter 192. Alternately, power source 194 can be incorporated within part identifier 191 and within RF-responsive transmitter 192.

Power source 194 can comprise at least one of a RF-to-DC converter, a DC-to-DC converter, and a battery. For example, RF-to-DC converter can comprise at least one of an antenna, diode, and filter. In one case, a RF-to-DC converter can convert at least one process related frequency into a DC signal. In another case, a RF-to-DC converter can convert at least one non-process related frequency into a DC signal. For instance, an external signal can be provided to the converter. Alternately, a RF-to-DC converter can convert at least one plasma related frequency into a DC signal.

Figure 4A:
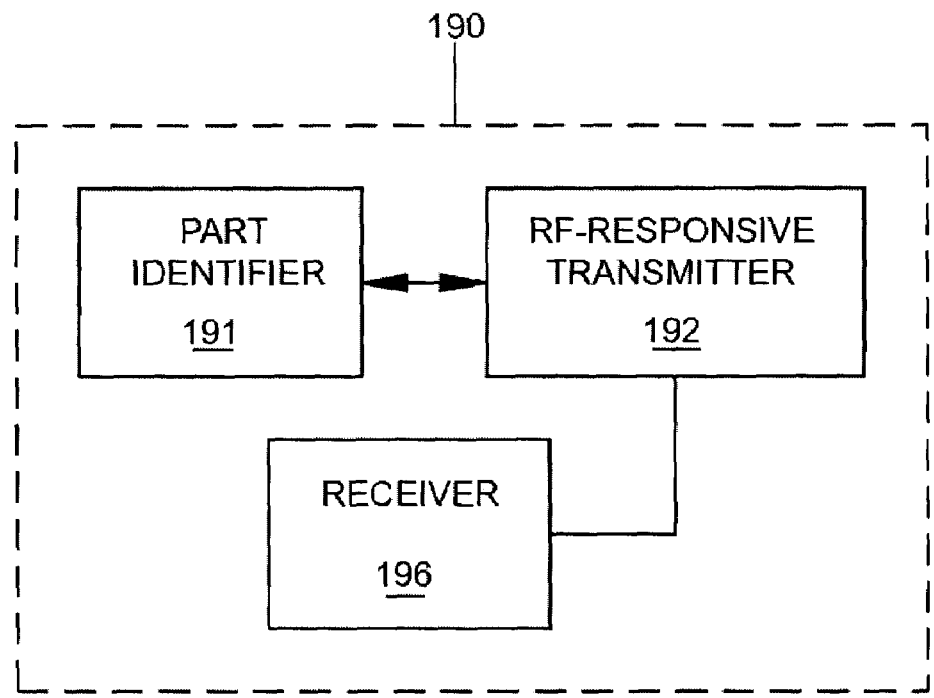
FIGS. 4a–4c show simplified block diagrams of a RF-responsive part identifier in accordance with additional embodiments of the present invention.
Figure 4B:
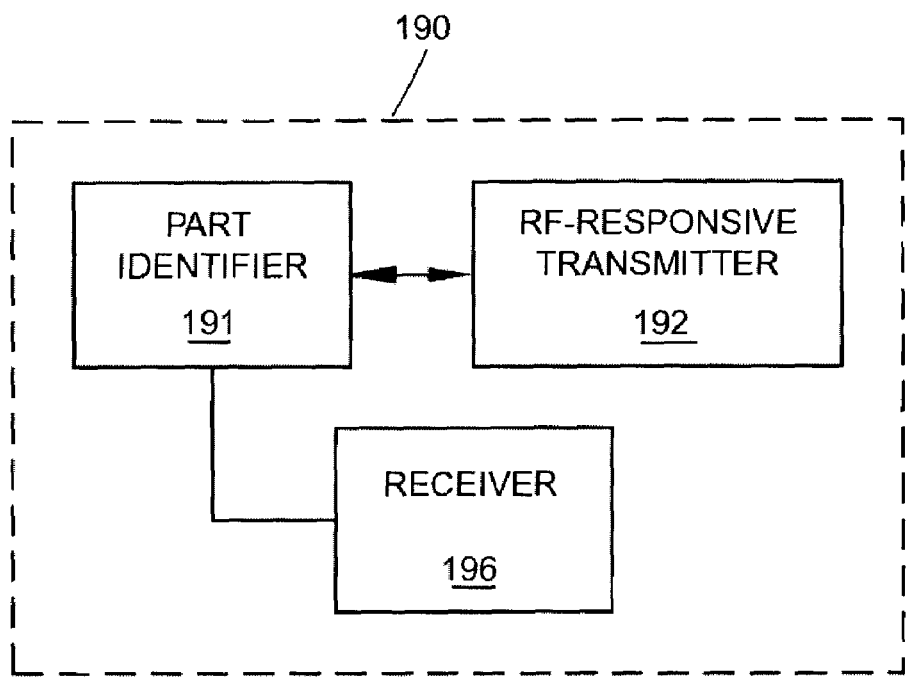
Figure 4C:
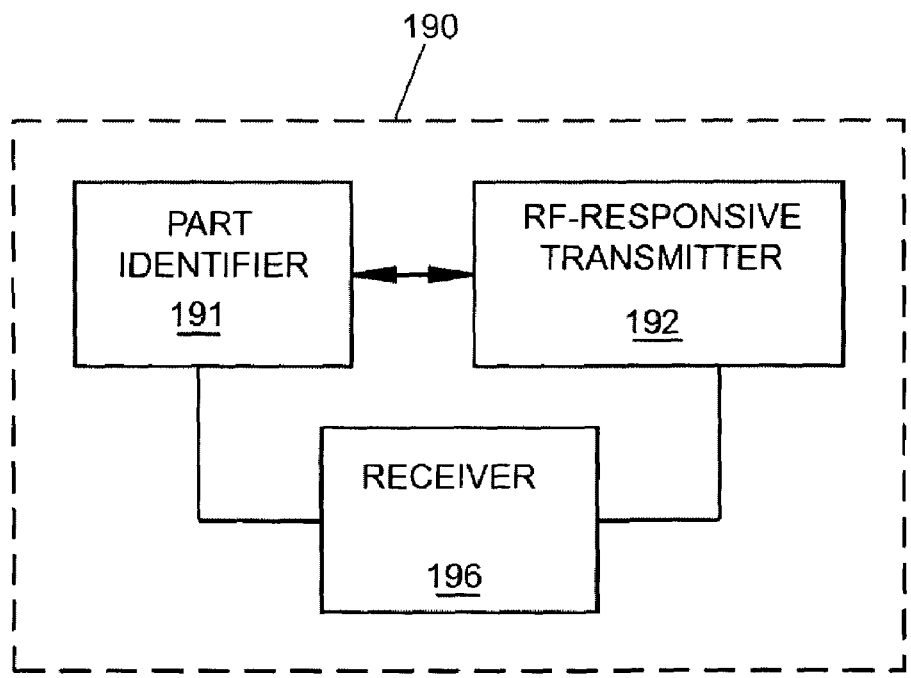

FIGS. 4a–4c show simplified block diagrams of a RF-responsive part identifier in accordance with additional embodiments of the present invention. In the illustrated embodiments, RF-responsive part identifier 190 comprises part identifier 191, RF-responsive transmitter 192, and receiver 196.

As shown in FIG. 4a, receiver 196 can be coupled to RF-responsive transmitter 192. Alternately, receiver 196 can be incorporated within RF-responsive transmitter 192. As shown in FIG. 4b, receiver 196 can be coupled to part identifier 191. Alternately, receiver 196 can be incorporated within part identifier 191. As shown in FIG. 4c, receiver 196 can be coupled to part identifier 191 and RF-responsive transmitter 192. Alternately, receiver 196 can be incorporated within part identifier 191 and within RF-responsive transmitter 192.

Receiver 196 can comprise at least one of a power source, a signal source, an antenna, down converter, demodulator, decoder, controller, memory (e.g., volatile and/or non-volatile memory), and converters. For example, the receiver can be used to receive and process narrowband and wideband signals including AM signals, FM signals, and/or PM signals. In addition, the receiver can also receive and process coded signals and/or spread spectrum signals to increase its performance within a high interference environment such as a semiconductor processing facility.

Figure 5A:
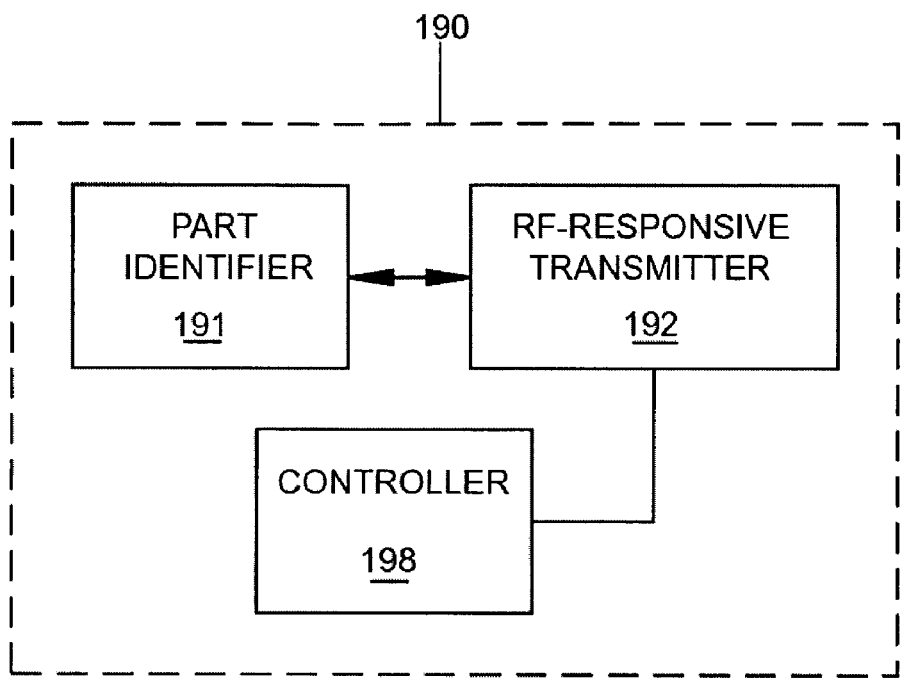
FIGS. 5a–5c show simplified block diagrams of a RF-responsive part identifier in accordance with additional embodiments of the present invention.
Figure 5B:
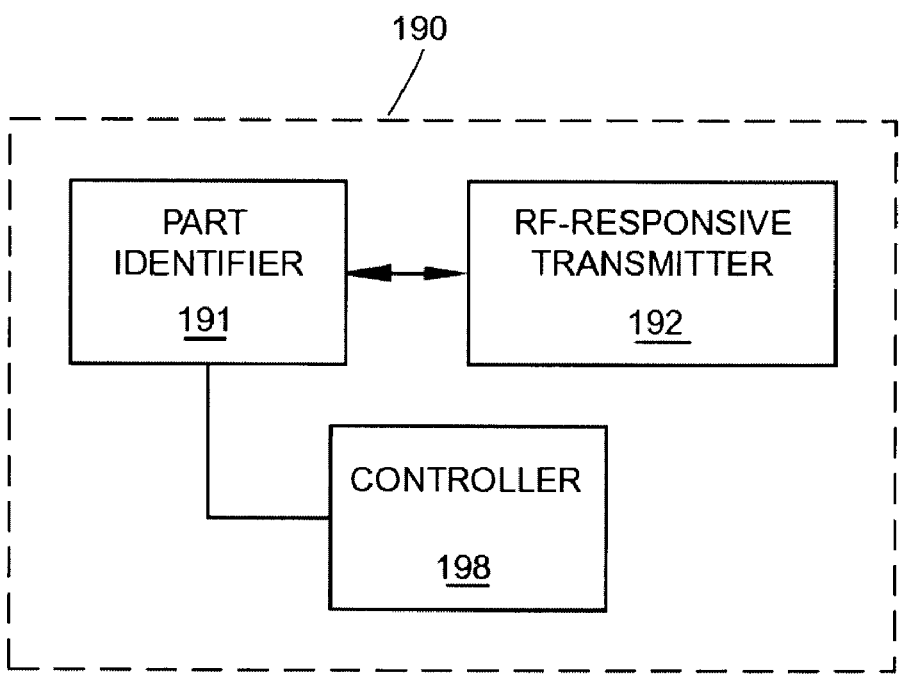
Figure 5C:
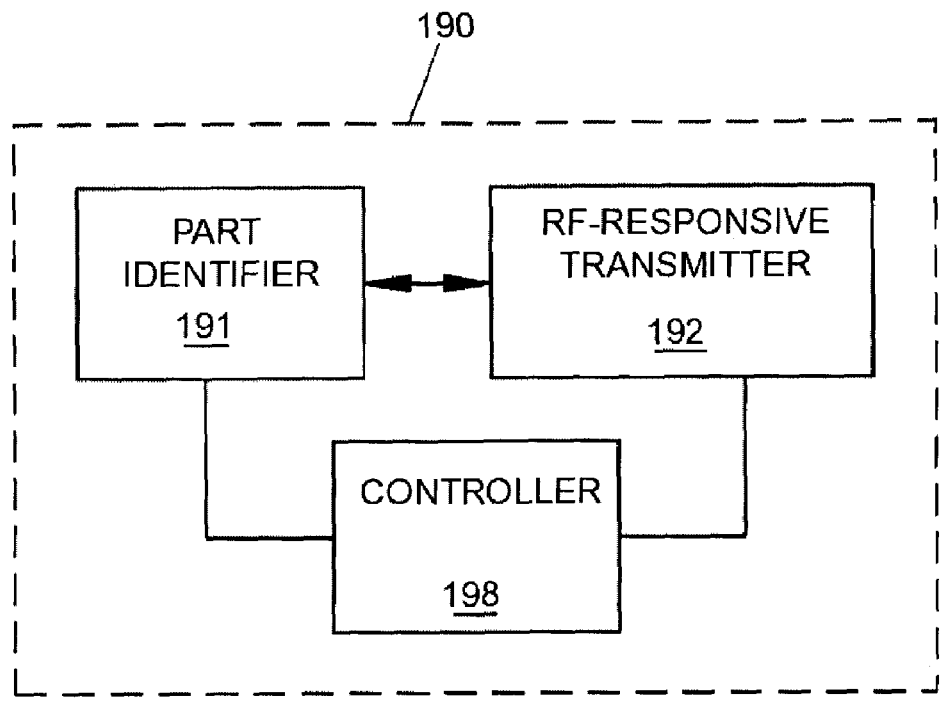

FIGS. 5a–5c show simplified block diagrams of a RF-responsive part identifier in accordance with additional embodiments of the present invention. In the illustrated embodiments, RF-responsive part identifier 190 comprises part identifier 191, RF-responsive transmitter 192, and controller 198.

As shown in FIG. 5a, controller 198 can be coupled to RF-responsive transmitter 192. Alternately, controller 198 can be incorporated within RF-responsive transmitter 192. As shown in FIG. 5b, controller 198 can be coupled to part identifier 191. Alternately, controller 198 can be incorporated within part identifier 191. As shown in FIG. 5c, controller 198 can be coupled to part identifier 191 and RF-responsive transmitter 192. Alternately, controller 198 can be incorporated within part identifier 191 and within RF-responsive transmitter 192.

Controller 198 can comprise at least one of a microprocessor, digital signal processor (DSP), memory (e.g., volatile and/or non-volatile memory), A/D converter, and D/A converter. For example, the controller can be used to process data received from AM signals, FM signals, and/or PM signals and can be used to process data to be transmitted on AM signals, FM signals, and/or PM signals. In addition, controller 198 can be used to process coded signals and/or spread spectrum signals. Also, controller 198 can be used to store information such as measured data, instructional code, sensor information, and/or part information, which can include sensor identification and part identification data. For instance, input signal data can be provided to controller 198.

Figure 6A:
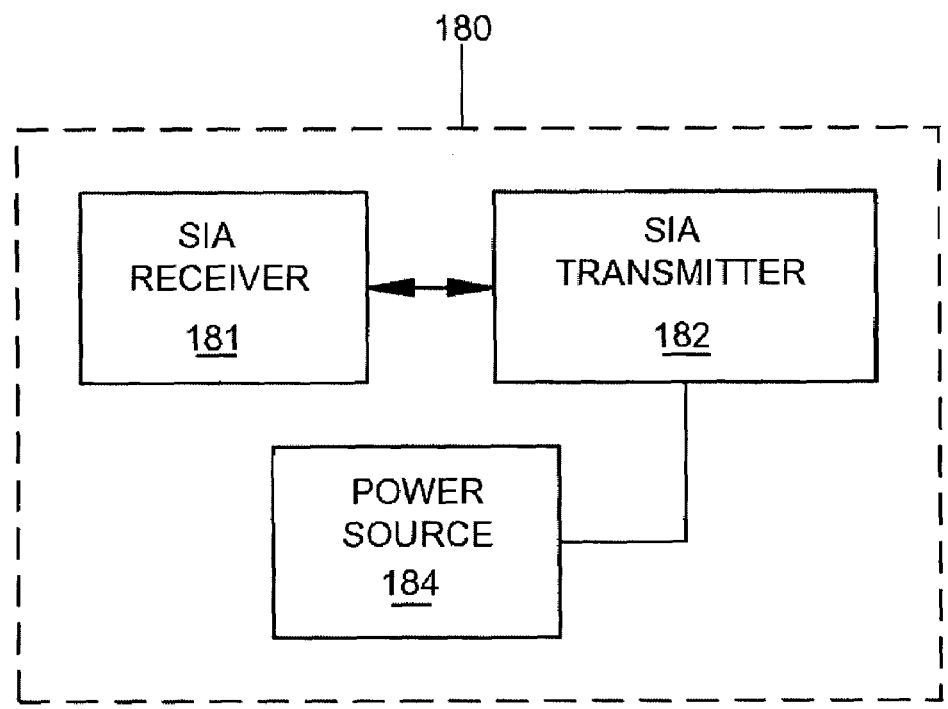
FIGS. 6a–6c show simplified block diagrams of a sensor interface assembly in accordance with embodiments of the present invention.
Figure 6B:
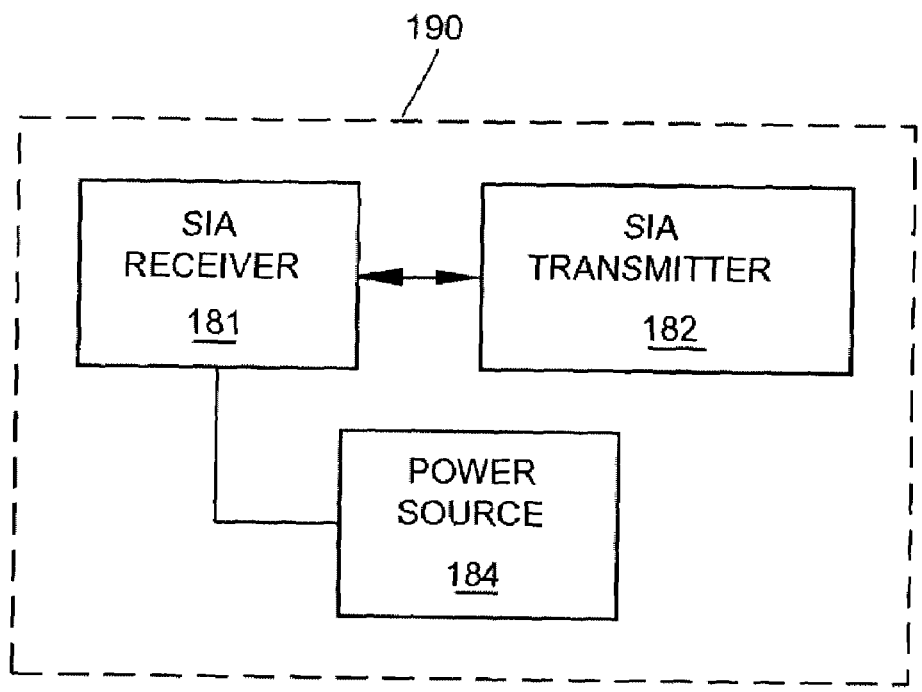
Figure 6C:
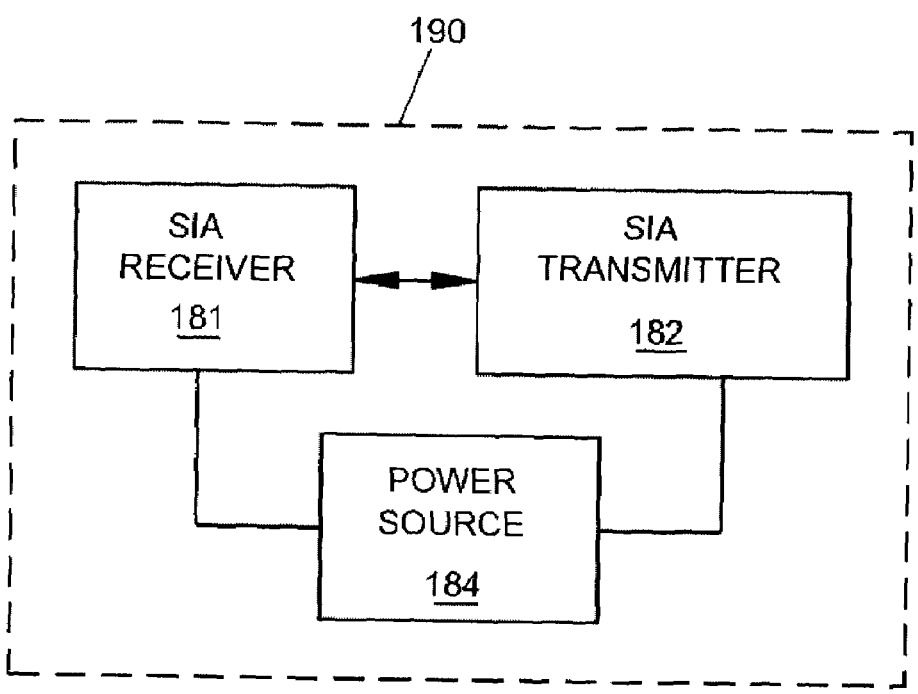

FIGS. 6a–6c show simplified block diagrams of a SIA in accordance with embodiments of the present invention. In the illustrated embodiments, SIA 180 comprises SIA receiver 181, SIA transmitter 182, and power source 184.

SIA transmitter 182 can be configured to transmit an input signal to at least one RF-responsive part identifier, and the at least one RF-responsive part identifier can use the input signal to control its operation. For example, a RF-responsive part identifier can use the input signal information to determine when to generate part ID data and/or when to transmit a response signal.

SIA transmitter 182 can comprise at least one of a power source, signal source, antenna, up converter, amplifier, modulator, coder, timer, controller, memory (e.g., volatile and/or non-volatile memory), a D/A converter, and an A/D converter. For example, the transmitter can be used to process and transmit narrowband and wideband signals including AM signals, FM signals, and/or PM signals. In addition, SIA transmitter 182 can be configured to process and transmit coded signals and/or spread spectrum signals to increase performance within a high interference environment such as a semiconductor processing facility.

SIA receiver 181 can be configured to receive a response signal from at least one RF-responsive part identifier, and the response signal can comprise part ID data.

SIA receiver 181 can comprise at least one of a power source, a signal source, antenna, down converter, demodulator, decoder, timer, controller, memory (e.g., volatile and/or non-volatile memory), a D/A converter, and an A/D converter. For example, the SIA receiver can be used to receive and process narrowband and wideband signals including AM signals, FM signals, and/or PM signals. In addition, SIA receiver 181 can also be configured to receive and process coded signals to increase performance within a high interference environment such as a semiconductor processing facility.

As shown in FIG. 6a, power source 184 can be coupled to SIA transmitter 182. Alternately, power source 184 can be incorporated within SIA transmitter 182. As shown in FIG. 6b, power source 184 can be coupled to SIA receiver 181. Alternately, power source 184 can be incorporated within SIA receiver 181. As shown in FIG. 6c, power source 184 can be coupled to SIA receiver 181 and SIA transmitter 182. Alternately, power source 184 can be incorporated within SIA receiver 181 and SIA transmitter 182.

Power source 184 can comprise at least one of a RF-to-DC converter, DC-to-DC converter, a battery, filter, timer, memory (e.g., volatile and/or non-volatile memory), and a controller. In addition, the power source can be external to the chamber and coupled to the SIA using one or more cables.

Figure 7A:
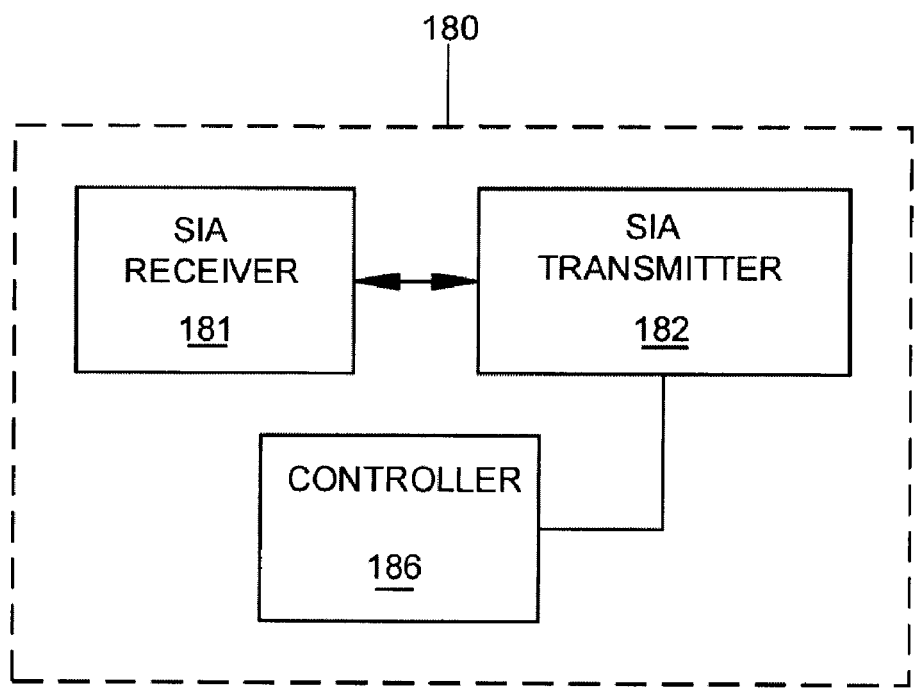
FIGS. 7a–7c show simplified block diagrams of a sensor interface assembly in accordance with additional embodiments of the present invention.
Figure 7B:
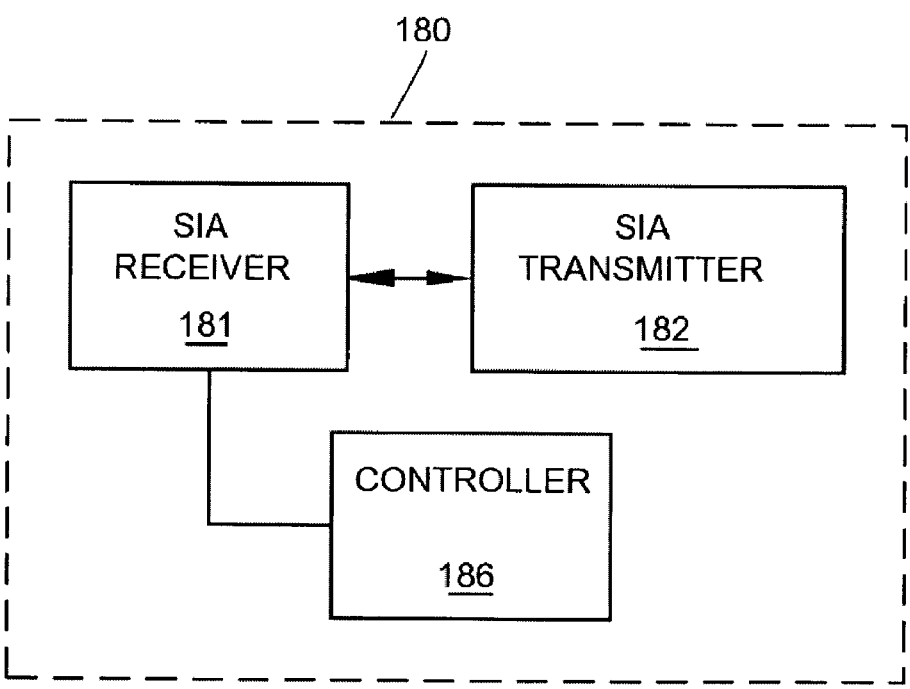
Figure 7C:
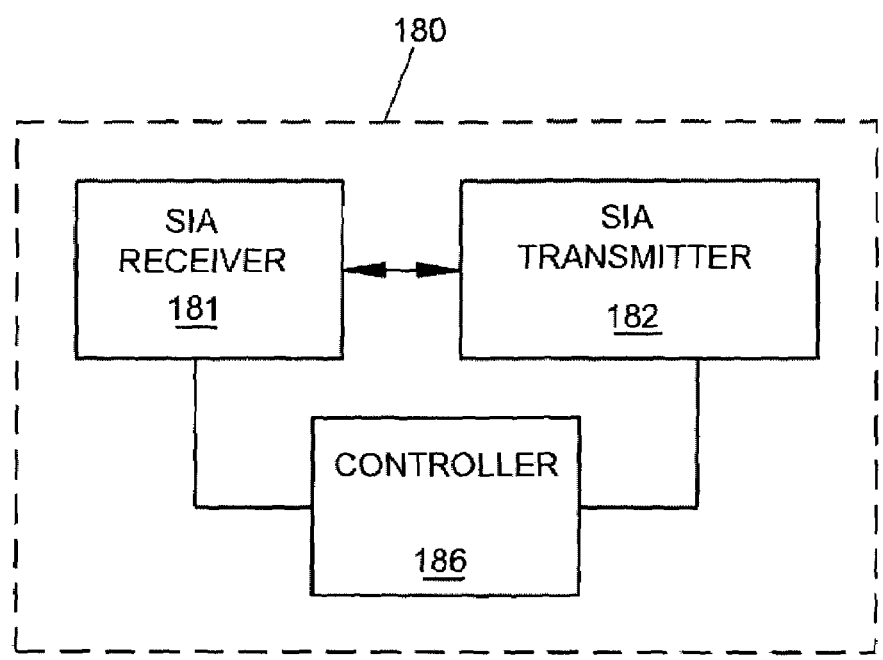

FIGS. 7a–7c show simplified block diagrams of a sensor interface assembly in accordance with additional embodiments of the present invention. In the illustrated embodiments, SIA 180 comprises SIA receiver 181, SIA transmitter 182, and controller 186.

As shown in FIG. 7a, controller 186 can be coupled to SIA receiver 181. Alternately, controller 186 can be incorporated within SIA receiver 181. As shown in FIG. 7b, controller 186 can be coupled to SIA transmitter 182. Alternately, controller 186 can be incorporated within SIA transmitter 182. As shown in FIG. 7c, controller 186 can be coupled to SIA receiver 181 and SIA transmitter 182. Alternately, controller 186 can be incorporated within SIA receiver 181 and SIA transmitter 182.

Controller 186 can comprise at least one of a microprocessor, microcontroller, digital signal processor (DSP), memory (e.g., volatile and/or non-volatile memory), A/D converter, and D/A converter. For example, the controller can be used to process data received from response signals and can be used to process data to be transmitted on input signals. Also, controller 186 can be used to store information such as measured data, instructional code, sensor information, and/or part information, which can include sensor identification and part identification data.

Figure 8A:
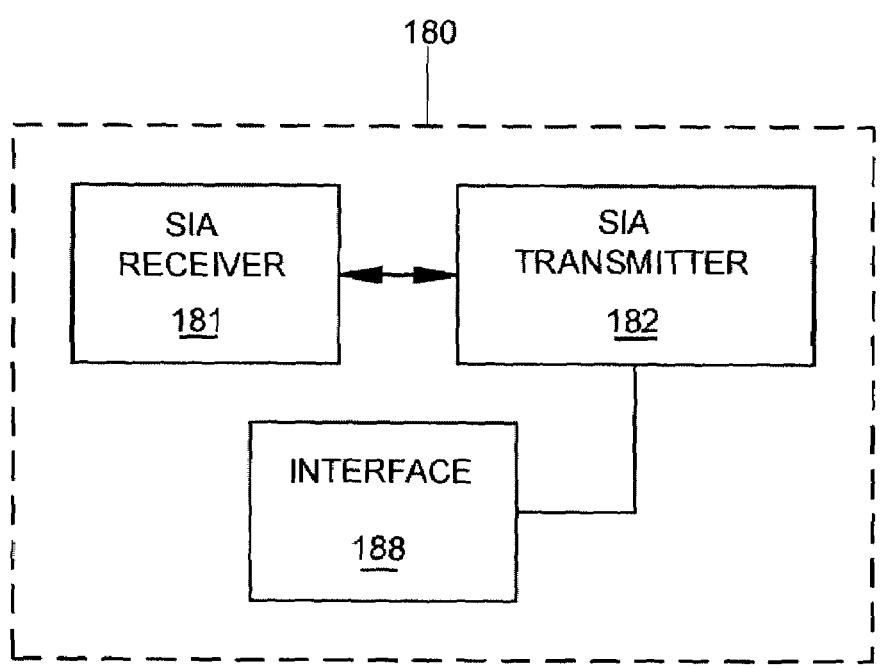
FIGS. 8a–8c show simplified block diagrams of a sensor interface assembly in accordance with additional embodiments of the present invention.
Figure 8B:
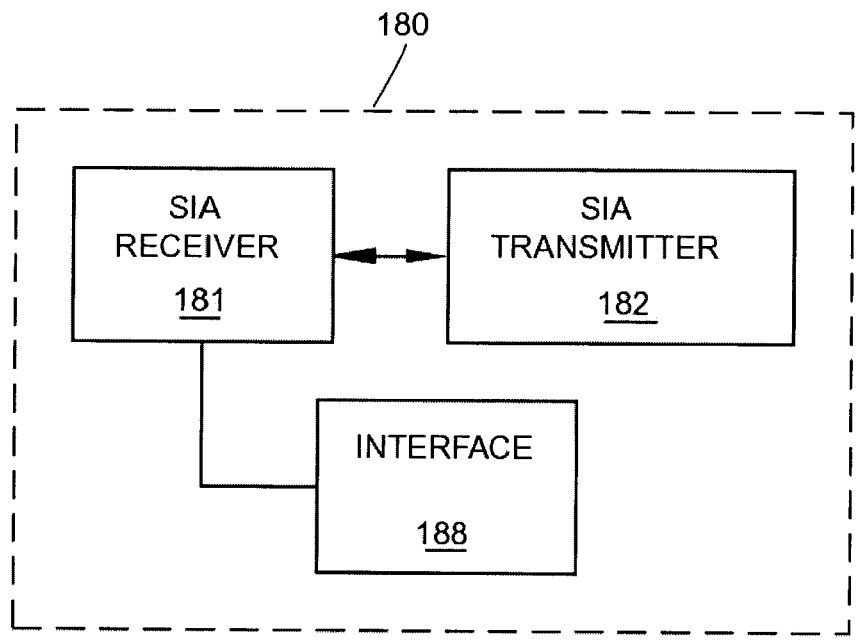
Figure 8C:
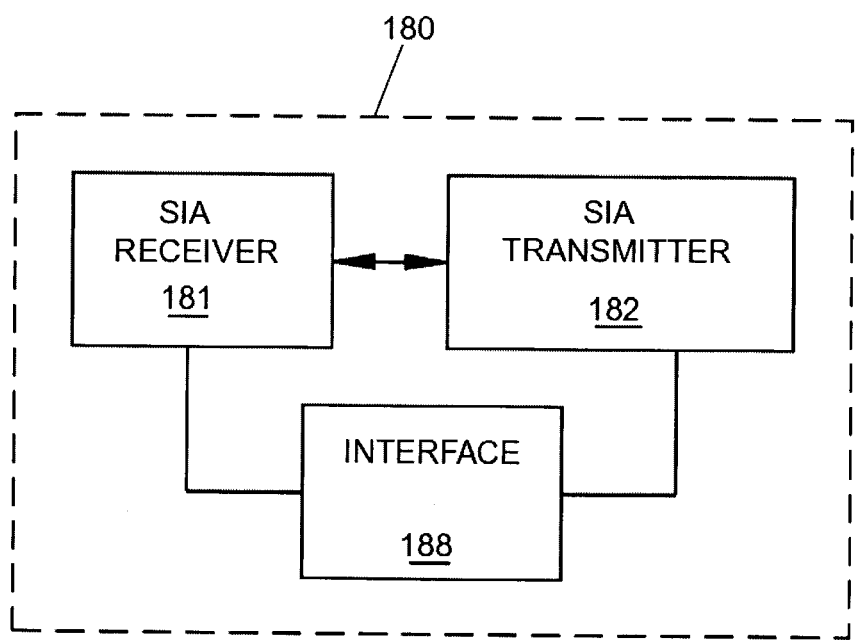

FIGS. 8a–8c show simplified block diagrams of a sensor interface assembly in accordance with additional embodiments of the present invention. In the illustrated embodiments, SIA 180 comprises SIA receiver 181, SIA transmitter 182, and interface 188.

As shown in FIG. 8a, interface 188 can be coupled to SIA transmitter 182. Alternately, interface 188 can be incorporated within SIA receiver 181. As shown in FIG. 8b, interface 188 can be coupled to SIA receiver 18. Alternately, interface 188 can be incorporated within SIA transmitter 182. As shown in FIG. 8c, interface 188 can be coupled to SIA receiver 181 and SIA transmitter 182. Alternately, interface 188 can be incorporated within SIA receiver 181 and SIA transmitter 182.

Interface 188 can comprise at least one of a power source, a signal source, a receiver, a transmitter, a controller, a processor, memory (e.g., volatile and/or non-volatile memory), a timer, and a converter. For example, the interface can be used to process data received from and sent to a system level component, such as controller 170 (FIG. 1).

Those skilled in the art will recognize that a receiver and transmitter can be combined into a transceiver.

Figure 9:
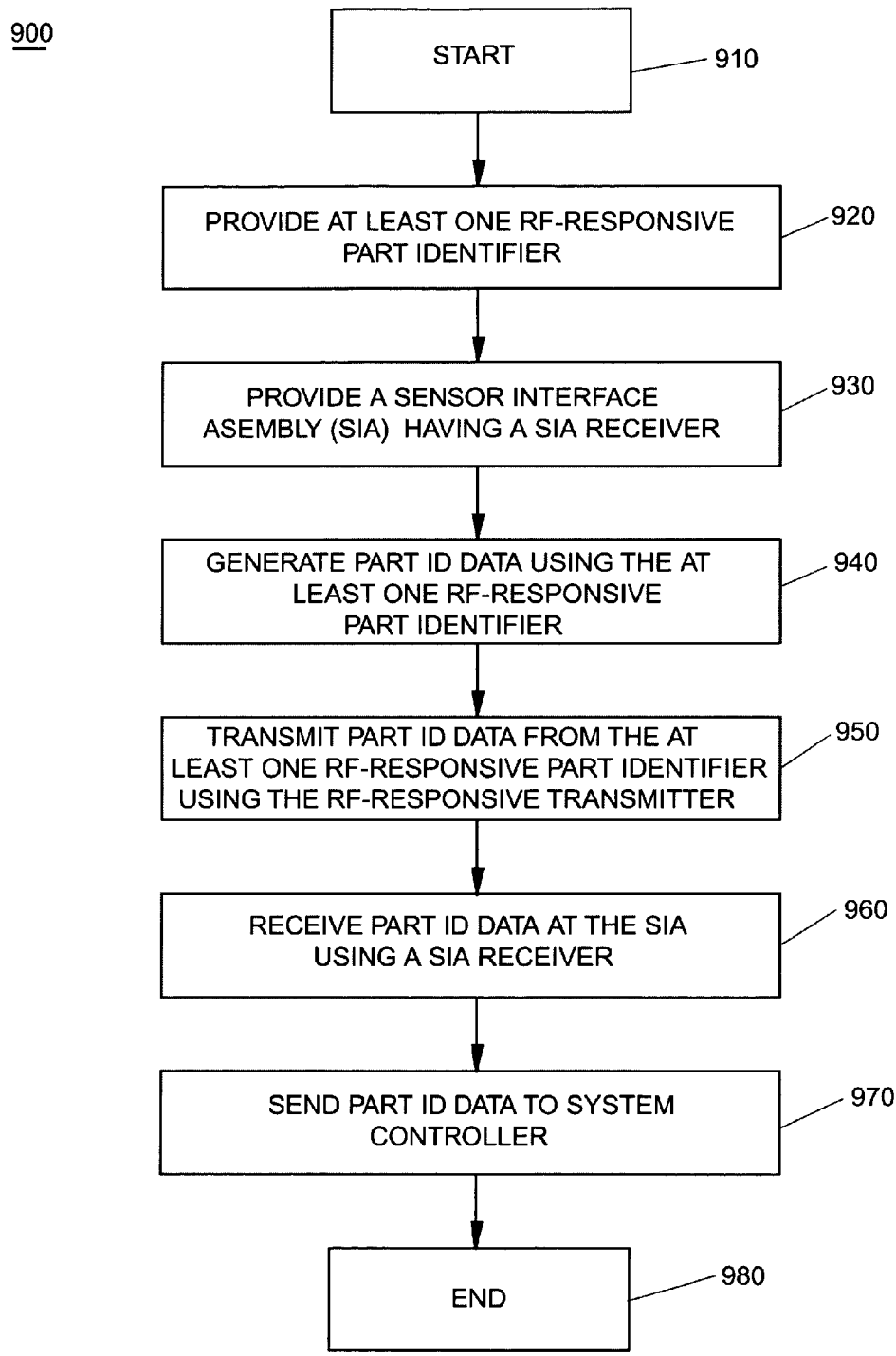
FIG. 9 illustrates a method for monitoring a material processing system according to an embodiment of the present invention.

FIG. 9 illustrates a method for monitoring a material processing system according to an embodiment of the present invention. Procedure 900 begins in 910.

In 920, at least one RF-responsive part identifier is provided. RF-responsive part identifiers can be provided in a number of different locations in a material processing system. For example, RF-responsive part identifiers can be located in chamber components, upper assembly components, and substrate holder components. Also, RF-responsive part identifiers can be installed in a chamber liner (process tube) when one is used in the material processing system. In addition, a RF-responsive part identifier can be coupled to a transfer system component, a RF system component, a gas supply system component, and/or an exhaust system component when one or more of these components are used in the material processing system.

A RF-responsive part identifier can comprise an RF-responsive transmitter coupled to a part identifier. In various embodiments, part identifier can comprise at least one of a memory (e.g., volatile and/or non-volatile memory), a processor, a timer, and a sensor. For example, memory can comprise at least one of read only, write only, and read/write memory, and static and/or dynamic RAM can be used. Processor can comprise at least one of read only, write only, and read/write memory, and can comprise the means to control the memory being used. Timer can comprise at least one of a continuously running timer and a triggered timer, and a triggered timer can be triggered by a process related or a non-process related frequency. For example, a timer can convert RF energy into a DC signal and use the DC signal to operate the timer. In this manner, RF hour data can be generated. Sensor can comprise one or more process-related sensors.

A part identifier can be configured to generate data, such as part ID data, and provide the data to an RF-responsive transmitter. Also, a part identifier can comprise at least one of a processor, memory (e.g., volatile and/or non-volatile memory), timer, and power source, and an status sensor to generate, store, and/or analyze data, such as part ID data, using internal control procedures and then provide the data to an RF-responsive transmitter. A part identifier can use a process related and/or non-process related signal to determine when to operate. Alternately, a part identifier can further comprise at least one of a receiver, transmitter, and housing.

In various embodiments, a RF-responsive transmitter comprises a transmitter and an antenna. For example, the transmitter can be configured to modulate and/or encode an input signal with data, such as the part ID data, and the antenna can be configured to transmit the input signal.

In other cases, an RF-responsive transmitter can comprise a modulator and an antenna, and the modulator can be configured to modulate an input signal with the status data and the antenna can be configured to transmit the modulated signal. Alternately, a RF-responsive transmitter can comprise an antenna and a backscatter modulator.

In 930, a sensor interface assembly (SIA) is provided. A SIA can be provided in a number of different locations in a material processing system. For example, a SIA can be located in the chamber, upper assembly, and substrate holder. In other embodiments, a SIA can be installed outside the chamber if a communication link can be established with a RF-responsive part identifier. Alternately, SIA can be coupled to a monitoring port or another input port.

A SIA can comprise a receiver configured to receive a response signal from at least one RF-responsive part identifier, and the response signal can comprise data, such as part ID data. For example, a RF-responsive part identifier can be configured to generate and transmit a response signal using internal control procedures that can be process dependent and/or process independent.

In addition, the SIA can comprise a transmitter configured to transmit an input signal to at least one RF-responsive part identifier, and the input signal can comprise operational data for the at least one RF-responsive part identifier. For example, a RF-responsive part identifier can be configured to generate and transmit a response signal when it receives an input signal from a SIA.

In other cases, the SIA can comprise a power source that can be coupled to the SIA transmitter and SIA receiver. In other embodiments, the SIA can comprise a controller that can be coupled to the SIA transmitter and SIA receiver.

In 940, a RF-responsive part identifier having a part identifier and a RF-responsive transmitter can be used to generate part ID data. A part identifier can generate part ID data before, during, and after a process. For example, RF-responsive part identifiers can generate part ID data for chamber components, upper assembly components, and substrate holder components. In addition, a RF-responsive part identifier can generate part ID data for a chamber liner (process tube) when one is used in the material processing system. Furthermore, a RF-responsive part identifier can generate part ID data for a transfer system component, a RF system component, a gas supply system component, and/or an exhaust system component.

For example, RF-responsive part identifiers can be configured to provide one or more component related properties. For example, part identifier 191 can be configured to generate part ID data that can comprise at least one of part ID data, system ID data, manufacturing data, and use data and to provide the part ID data to a RF-responsive transmitter. Part ID data can comprise information such as a part number that can be used to verify that the proper part has been installed in the system. System ID data can comprise information such as chamber ID data and tool ID data that can be used to determine system configuration. Manufacturing data can comprise information such as the manufacturer and the date of manufacture that can be used to verify that a genuine part is being used. Use data can comprise information such as usage time and process data. Part ID data can comprise measured and/or processed data that can be used to control a process, process chamber, and/or processing tool. Part ID data can also be used in installation, operational, and/or maintenance procedures. Part ID data can include measurements taken before, during, and/or after a process. Alternately, part ID data can include measurements taken before, during, and/or after a plasma process.

In an alternate embodiment, a RF-responsive part identifier can also measure and transmit contamination data such as exposure time, exposure strength, and exposure composition data. The SIA can optionally transmit data collected from one sensor to at least one other sensor in order to identify all of the contaminated parts.

In one or more embodiments, a RF-responsive part identifier can comprise a power source and the power source can be configured to use a process related frequency to cause the RF-responsive part identifier to generate part ID data. For example, the power source can convert some of the RF energy provided to a process chamber into a DC signal and use the DC signal to operate the part identifier in the RF-responsive part identifier. Alternately, the RF-responsive part identifier can comprise a battery coupled to the part identifier, and the DC signal can be used to cause the part identifier to begin generating part ID data.

In other embodiments, a RF-responsive part identifier can comprise a power source and the power source can be configured to use a non-plasma related frequency to cause the RF-responsive part identifier to generate part ID data. For example, the power source can convert some of the RF energy provided by an input signal into a DC signal and use the DC signal to operate the part identifier in the RF-responsive part identifier. Alternately, the RF-responsive part identifier can comprise a battery coupled to the part identifier, and the input signal can be used to cause the part identifier to begin generating part ID data.

In additional embodiments, a RF-responsive part identifier can be used in a plasma processing system and can be configured to use plasma related and non-plasma related frequencies to generate data such as part ID data.

In 950, at least one RF-responsive part identifier uses its RF-responsive transmitter to transmit the part ID data. For example, a RF-responsive transmitter can transmit a response signal that includes data such as the part ID data. In an alternate embodiment, a RF-responsive transmitter can be coupled to more than one part identifier, and a RF-responsive transmitter can be coupled to one or more sensors.

A RF-responsive part identifier can be provided in a number of different locations in a material processing system and can be configured to transmit part ID data before, during, and/or after a plasma process is performed by the material processing system. For example, RF-responsive part identifiers can be coupled to at least one of a chamber component, an upper assembly component, and a substrate holder component and can transmit part ID data from different locations in the system. In addition, a RF-responsive part identifier can transmit part ID data from a chamber liner (process tube) when one is used in the material processing system. Furthermore, a RF-responsive part identifier can transmit part ID data from a transfer system component, a RF system component, a gas supply system component, and/or an exhaust system component.

In some embodiments, a RF-responsive part identifier can comprise a power source, and the power source can be configured to use a plasma related frequency to cause the RF-responsive part identifier to transmit part ID data. For example, the power source can convert some of the RF energy provided to the process chamber into a DC signal and use the DC signal to operate the transmitter in the RF-responsive part identifier. Also, the RF-responsive part identifier can comprise a battery coupled to the transmitter and can use a process related signal to cause the RF-responsive transmitter to begin transmitting data.

In other embodiments, a RF-responsive part identifier can comprise a power source and the power source can be configured to use a non-process related frequency to cause the RF-responsive part identifier to transmit part ID data. For example, the power source can convert some of the RF energy provided by an input signal into a DC signal and use the DC signal to operate the transmitter in the RF-responsive part identifier. Also, the RF-responsive part identifier can comprise a battery coupled to the transmitter and can use the input signal to cause the RF-responsive transmitter to begin transmitting data.

Furthermore, the RF-responsive part identifier can transmit a response signal using a plasma related frequency or a non-plasma related frequency when transmitting data such as part ID data.

In alternate embodiments, a RF-responsive part identifier can comprise a receiver that can be used to receive an input signal. For example, a receiver can be configured to receive an input signal and to use the input signal to generate operational data for controlling the RF-responsive part identifier. Also, the RF-responsive part identifier can use the input signal to determine when to generate data and/or when to transmit data.

In other embodiments, a RF-responsive part identifier can comprise a memory that can be used to store data such as part ID data. Part ID data can be stored during part of a process and transmitted during a different part of the process. For example, part ID data can be stored during a plasma event and transmitted after the plasma event has ended.

In other embodiments, a RF-responsive part identifier can comprise a controller that can be used to control the operation of the RF-responsive part identifier. The controller can comprise operational data and/or receive operational data from an SIA. For example, the controller can be used to determine when to generate and transmit the part ID data.

In some embodiments, a RF-responsive part identifier can comprise a timer. Timer can comprise at least one of a continuously running timer and a triggered timer, and a triggered timer can be triggered by a process related or a non-process related frequency. For example, a timer can convert RF energy into a DC signal and use the DC signal to operate the timer. In this manner, RF hour data can be generated. Also, a timer can be triggered by an input signal received by the RF-responsive part identifier.

In 960, a SIA can be used to receive a response signal from one or more RF-responsive part identifiers, and the response signal can comprise data such as part ID data. For example, the receiver in the SIA can be configured to receive one or more response signals during an entire process or during part of a process. In some cases, a RF-responsive part identifier can transmit part ID data when a RF signal is provided to a process chamber.

In addition, a SIA can be used to transmit an input signal to one or more RF-responsive part identifiers. For example, the transmitter in the SIA can be configured to transmit one or more input signals during an entire process or during part of a process. In some cases, a RF-responsive part identifier can transmit part ID data to a SIA when it receives an input signal from the SIA. An input signal, for example, can comprise operational data for the RF-responsive part identifier.

The SIA can use internal and/or external control data to determine when to receive and when to transmit signals. For example, a SIA can be configured to operate before, during, and/or after a process is performed by the material processing system A SIA can be provided at one or more locations in a material processing system and. For example, a SIA can be coupled to at least one of a chamber wall, an upper assembly, and a substrate holder and can receive part ID data from different locations in the system. In addition, a SIA can receive part ID data from a RF-responsive part identifier coupled to a chamber liner (process tube) when one is used in the material processing system. Furthermore, a SIA can receive part ID data from a RF-responsive part identifier coupled to a transfer system component, a RF system component, a gas supply system component, and/or an exhaust system component.

In some embodiments, a SIA can comprise a power source and the power source can be configured to use a plasma related frequency to cause the SIA to operate. For example, the power source can comprise a RF-to-DC converter that can convert some of the RF energy provided to the plasma chamber into a DC signal, and the DC signal can be used to operate the transmitter and/or receiver in the SIA.

In other embodiments, a SIA can comprise a power source and the power source can be configured to use a non-plasma related frequency to cause the SIA to operate. For example, the power source can comprise a RF-to-DC converter that can convert some of the RF energy provided by an external signal into a DC signal, and the DC signal can be used to operate the transmitter and/or receiver in the SIA.

In addition, the power source can be external to the chamber and coupled to the SIA using one or more cables. Also, the power source can comprise a battery.

In 970, the SIA can send data such as part ID data to the system controller. In addition, the SIA can preprocess the part ID data. For example, the SIA can compress and/or encrypt the data. Procedure 900 ends in 980.

The SIA and/or a system controller can be configured to analyze data such as the part ID data and to use the analysis results to control a process and/or control a processing tool. The SIA and/or a system controller can be configured to compare the part ID data with target part ID data, and to use the comparison to control a process and/or control a processing tool. Also, the SIA and/or a system controller can be configured to compare the part ID data with historical part ID data, and to use the comparison to predict, prevent, and/or declare a fault. Furthermore, the SIA and/or a system controller can be configured to analyze data such as the part ID data and to use the analysis results to determine when to perform maintenance on a component.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A material processing system comprising:
a processing tool, wherein the processing tool includes at least one process chamber;
a plurality of RF (radio-frequency)-responsive part identifiers coupled to the processing tool, a RF-responsive part identifier being configured to generate part ID (identification) data for the processing tool and transmit the part ID data;
a sensor interface assembly (SIA) configured to receive the part ID data from at least one RF-responsive part identifier, and
a controller coupled to the SIA and configured to verify that a proper part has been installed in the material processing system based on said part ID data.

2. The material processing system as claimed in claim 1, wherein the part ID data comprises at least one of part ID number, system ID data, manufacturing data, and use data.

3. The material processing system as claimed in claim 1, wherein at least one RF-responsive part identifier comprises:
a contamination sensor for generating contamination data; and
a RF-responsive transmitter coupled to the contamination sensor for transmitting the contamination data.

4. The material processing system as claimed in claim 3, wherein the contamination data comprises at least one of exposure time, exposure strength, and exposure composition data.

5. The material processing system as claimed in claim 1, wherein the at least one RF-responsive part identifier comprises:
a part identifier for generating the part ID data; and
a RF-responsive transmitter coupled to the part identifier for transmitting the part ID data.

6. The material processing system as claimed in claim 5, wherein the part identifier comprises at least one of memory, a controller, a timer, a micro-controller, and a microprocessor.

7. The material processing system as claimed in claim 5, wherein the at least one RF-responsive part identifier further comprises a timer coupled to at least one of the part identifier and the RF-responsive transmitter.

8. The material processing system as claimed in claim 5, wherein the RF-responsive transmitter comprises an antenna configured to transmit a response signal, and a transmitter coupled to the antenna, wherein the transmitter is configured to modulate and/or encode the response signal with the part ID data.

9. The material processing system as claimed in claim 5, wherein the RF-responsive part identifier further comprises a power source coupled to at least one of the part identifier and the RF-responsive transmitter.

10. The material processing system as claimed in claim 9, wherein the power source comprises at least one of a RF-to-DC converter configured to convert energy emitted from a plasma related signal into a DC signal, a RF-to-DC converter configured to convert a non-plasma related signal into a DC signal, a DC-to-DC converter, and a battery.

11. The material processing system as claimed in claim 10, wherein the power source provides the DC signal to the part identifier.

12. The material processing system as claimed in claim 10, wherein the power source provides the DC signal to the RF-responsive transmitter.

13. The material processing system as claimed in claim 5, wherein the at least one RF-responsive part identifier further comprises a part identifier controller coupled to at least one of the part identifier and the RF-responsive transmitter.

14. The material processing system as claimed in claim 13, wherein the part identifier controller comprises at least one of a microprocessor, a microcontroller, a timer, digital signal processor (DSP), memory, receiver, A/D converter, and D/A converter.

15. The material processing system as claimed in claim 1, wherein the at least one RF-responsive part identifier is coupled to a chamber component.

16. The material processing system as claimed in claim 15, wherein the at least one RF-responsive part identifier comprises:
 a part identifier configured to generate part ID data for the chamber component; and
 a RF-responsive transmitter coupled to the part identifier for transmitting the part ID data for the chamber component.

17. The material processing system as claimed in claim 1, further comprising an upper assembly, wherein the at least one RF-responsive part identifier is coupled to at least one component of the upper assembly.

18. The material processing system as claimed in claim 17, wherein the at least one RF-responsive part identifier comprises:
 a part identifier configured to generate part ID data for the at least one component of the upper assembly; and
 a RF-responsive transmitter coupled to the part identifier for transmitting the part ID data for the at least one component of the upper assembly.

19. The material processing system as claimed in claim 1, further comprising a substrate holder, wherein the at least one RF-responsive part identifier is coupled to the substrate holder.

20. The material processing system as claimed in claim 19, wherein the substrate holder comprises at least one of a chuck, an electrostatic chuck (ESC), a shield, a focus ring, a baffle, and an electrode.

21. The material processing system as claimed in claim 19, wherein the at least one RF-responsive part identifier comprises:
 a part identifier configured to generate part ID data for the substrate holder; and
 a RF-responsive transmitter coupled to the part identifier for transmitting the part ID data for the substrate holder.

22. The material processing system as claimed in claim 19, wherein the at least one RF-responsive part identifier comprises:
 a part identifier configured to generate part ID data for a wafer on the substrate holder; and
 a RF-responsive transmitter coupled to the part identifier for transmitting the part ID data for the wafer.

23. The material processing system as claimed in claim 1, further comprising a ring, wherein the at least one RF-responsive part identifier is coupled to the ring.

24. The material processing system as claimed in claim 23, wherein the ring comprises at least one of a focus ring, a shield ring, an electrode ring, and an insulator ring.

25. The material processing system as claimed in claim 23, wherein the at least one RF-responsive part identifier comprises:
 a part identifier configured to generate part ID data for the ring; and
 a RF-responsive transmitter coupled to the part identifier for transmitting the part ID data for the ring.

26. The material processing system as claimed in claim 1, further comprising a plate, wherein the at least one RF-responsive part identifier is coupled to the plate.

27. The material processing system as claimed in claim 26, wherein the plate comprises at least one of an exhaust plate, a baffle plate, an electrode plate, and an insulator plate.

28. The material processing system as claimed in claim 26, wherein the at least one RF-responsive part identifier comprises:
 a part identifier configured to generate part ID data for the plate; and
 a RF-responsive transmitter coupled to the part identifier for transmitting the part ID data for the plate.

29. The material processing system as claimed in claim 1, wherein the at least one RF-responsive part identifier comprises:
 a part identifier for generating part ID data;
 a RF-responsive transmitter coupled to the part identifier for transmitting the part ID data; and
 a receiver coupled to at least one of the part identifier and the RF-responsive transmitter.

30. The material processing system as claimed in claim 29, wherein the RF-responsive transmitter comprises an antenna and a backscatter modulator.

31. The material processing system as claimed in claim 29, wherein the RF-responsive transmitter comprises an antenna configured to transmit a response signal, and a transmitter coupled to the antenna, wherein the transmitter is configured to modulate and/or encode the response signal with the part ID data.

32. The material processing system as claimed in claim 31, wherein the RF-responsive transmitter further comprises at least one of a RF-to-DC converter, a DC-to-DC converter, and a battery.

33. The material processing system as claimed in claim 29, wherein the RF-responsive part identifier further comprises at least one power source, a power source producing a DC signal using at least one of a RF-to-DC converter, a DC-to-DC converter, and a battery.

34. The material processing system as claimed in claim 29, wherein the receiver comprises an antenna and processor, the antenna being configured to receive an input signal, the processor being configured to use the input signal to generate operational data, and to use the operational data to control at least one of the RF-responsive transmitter, the receiver, and the part identifier.

35. The material processing system as claimed in claim 34, wherein the receiver further comprises at least one of a RF-to-DC converter configured to convert energy emitted from a process related signal into a DC signal, a RF-to-DC converter configured to convert a non-process related signal into a DC signal, a DC-to-DC converter, and a battery.

36. The material processing system as claimed in claim 29, wherein the at least one RF-responsive part identifier further comprises a part identifier controller coupled to at least one of the receiver, the part identifier, and the RF-responsive transmitter.

37. The material processing system as claimed in claim 36, wherein the part identifier controller comprises at least one of a microprocessor, a microcontroller, digital signal processor (DSP), memory, A/D converter, and D/A converter.

38. The material processing system as claimed in claim 1, wherein the at least one RF-responsive part identifier comprises:
a part identifier for generating part ID data; and
a RF-responsive transceiver coupled to the part identifier for transmitting the part ID data.

39. The material processing system as claimed in claim 38, wherein the RF-responsive transceiver comprises an antenna configured to transmit a response signal, a transmitter coupled to the antenna, wherein the transmitter is configured to modulate and/or encode the response signal with the part ID data, a second antenna, receiver, and processor, the second antenna being configured to receive an input signal, the receiver being configured to use the input signal to generate operational data, the processor being configured to use the operational data to control the RF-responsive transceiver.

40. The material processing system as claimed in claim 38, wherein the at least one RF-responsive part identifier further comprises a part identifier controller coupled to at least one of the part identifier and the RF-responsive transceiver.

41. The material processing system as claimed in claim 40, wherein the part identifier controller comprises at least one of a microprocessor, a microcontroller, digital signal processor (DSP), timer, memory, A/D converter, and D/A converter.

42. The material processing system as claimed in claim 38, wherein the at least one RF-responsive part identifier further comprises at least one power source coupled to at least one of the part identifier and the RF-responsive transceiver, a power source comprising at least one of a RF-to-DC converter, a DC-to-DC converter, and a battery.

43. The material processing system as claimed in claim 1, wherein the SIA comprises:
a receiver configured to receive a response signal containing the part ID data from the at least one RF-responsive part identifier; and
a transmitter configured to transmit an input signal to the at least one RF-responsive part identifier, wherein the input signal causes the at least one RF-responsive part identifier to send the response signal to the receiver.

44. The material processing system as claimed in claim 1, wherein
said controller coupled to the SIA being configured to analyze the part ID data, wherein the controller compares the part ID data with target electrical performance data, and to use the comparison to change a process.

45. The material processing system as claimed in claim 1, wherein
said controller coupled to the SIA being configured to analyze the part ID data, wherein the controller compares the part ID data with historical part ID data, and to use the comparison to predict a fault.

46. The material processing system as claimed in claim 1, wherein
said controller coupled to the SIA being configured to analyze the part ID data, wherein the controller compares the part ID data with historical part ID data, and to use the comparison to declare a fault.

47. The material processing system as claimed in claim 1, wherein
said controller coupled to the SIA being configured to provide instructional data to the SIA.

48. The material processing system as claimed in claim 1, wherein
said controller coupled to the SIA being configured to analyze the part ID data and control the processing tool.

49. The material processing system as claimed in claim 1, further comprising a RF system, wherein a RF-responsive part identifier is coupled to at least one RF system component.

50. The material processing system as claimed in claim 1, further comprising a gas supply system, wherein a RF-responsive part identifier is coupled to at least one gas supply system component.

51. The material processing system as claimed in claim 1, further comprising a transfer system, wherein a RF-responsive part identifier is coupled to at least one transfer system component.

52. The material processing system as claimed in claim 1, further comprising an exhaust system, wherein a RF-responsive part identifier is coupled to at least one exhaust system component.

53. The material processing system as claimed in claim 1, the controller is configured to analyze the part ID data and to use the analysis results to determine when to perform maintenance on the processing tool.

54. The material processing system of claim 1, wherein said controller is configured to determine a configuration of said material processing system based on said part ID data.

55. The material processing system of claim 1, wherein said controller is configured to verify that a genuine part is being used in the material processing system based on said part ID data.

56. A plasma processing system comprising:
a processing tool, wherein the processing tool includes a plasma chamber;
a plurality of RF (radio-frequency)-responsive part identifiers coupled to the processing tool to generate and transmit part ID data, wherein at least one RF-responsive part identifier is coupled to the plasma chamber;
a sensor interface assembly (SIA) configured to receive the part ID (identification) data from the plurality of RF-responsive part identifiers; and
a controller coupled to the SIA and configured to verify that a proper part has been installed in the plasma processing system based on said part ID data.

57. The material processing system as claimed in claim 56, wherein
said controller coupled to the SIA being configured to analyze the part ID data and control the plasma processing system.

58. A method of monitoring a material processing system comprising a processing tool, wherein the processing tool includes at least one process chamber, the method comprising:
providing a RF (radio-frequency)-responsive part identifier coupled to the processing tool, wherein the RF-responsive part identifier is configured to generate and transmit part ID (identification) data;
providing a sensor interface assembly (SIA), wherein the SIA is configured to receive the part ID data from the RF-responsive part identifier; and
verifying that a proper part has been installed in the material processing system based on said part ID data.

59. The method of monitoring a material processing system as claimed in claim 58, the method further comprising:
generating the part ID data; and
transmitting the part ID data, wherein the RF-responsive part identifier receives an input signal comprising operational data and uses the operational data to transmit the part ID data using a response signal.

60. The method of monitoring a material processing system as claimed in claim 58, the method further comprising:
generating part ID data; and
transmitting the part ID data, wherein the part ID data comprises contamination data that includes at least one of exposure time data, exposure strength data, and exposure composition data.

61. The method of monitoring a material processing system as claimed in claim 58, wherein the method further comprises:
coupling at least one RF-responsive part identifier to a chamber component;
generating part ID data for the chamber component; and
transmitting the part ID data for the chamber component as a spread spectrum signal, wherein the at least one RF-responsive part identifier comprises a part identifier and a RF-responsive transmitter coupled to the part identifier.

62. The method of monitoring a material processing system as claimed in claim 58, wherein the method further comprises:
coupling at least one RF-responsive part identifier to a component of an upper assembly;
generating part ID data for the component of the upper assembly; and
transmitting the part ID data for the component of the upper assembly, wherein the at least one RF-responsive part identifier comprises a part identifier and a RF-responsive transmitter coupled to the part identifier.

63. The method of momtoring a material processing system as claimed in claim 58, wherein the method further comprises:
coupling at least one RF-responsive part identifier to a substrate holder;
generating part ID data for the substrate holder; and
transmitting the part ID data for the substrate holder, wherein the at least one RF-responsive part identifier comprises a part identifier and a RF-responsive transmitter coupled to the part identifier.

64. The method of monitoring a material processing system as claimed in claim 58, wherein the method further comprises:
coupling at least one RF-responsive part identifier to a wafer;
generating part ID data for the wafer; and
transmitting the part ID data for the wafer, wherein the at least one RF-responsive part identifier comprises a part identifier and a RF-responsive transmitter coupled to the part identifier.

65. The method of monitoring a material processing system as claimed in claim 58, wherein the method further comprises:
coupling a RF-responsive part identifier to at least one of a transfer system component, a RF system component, a gas supply system component, and an exhaust system component;
generating part ID data for the component; and
transmitting the part ID data for the component, wherein the at least one RF-responsive part identifier comprises a part identifier and a RF-responsive transmitter coupled to the part identifier.

66. The method of monitoring a material processing system as claimed in claim 58, wherein the method further comprises:
coupling at least one RF-responsive part identifier to a ring;
generating part ID data for the ring; and
transmitting the part ID data for the ring, wherein the at least one RF-responsive part identifier comprises a part identifier and a RF-responsive transmitter coupled to the part identifier.

67. The method of monitoring a material processing system as claimed in claim 66, wherein the ring comprises at least one of a focus ring, a shield ring, a deposition ring, an electrode ring, and an insulator ring.

68. The method of monitoring a material processing system as claimed in claim 58, wherein the method further comprises:
coupling at least one RF-responsive part identifier to a plate;
generating part ID data for the plate; and
transmitting the part ID data for the plate, wherein the at least one RF-responsive part identifier comprises a part identifier and a RF-responsive transmitter coupled to the part identifier.

69. The method of monitoring a material processing system as claimed in claim 68, wherein the plate comprises at least one of a baffle plate, an exhaust plate, an electrode plate, and an injection plate.

70. The method of monitoring a material processing system as claimed in claim 58, wherein the method further comprises:
coupling at least one power source to the RF-responsive part identifier, wherein the RF-responsive part identifier comprises a part identifier and a RF-responsive transmitter coupled to the part identifier;
generating a DC signal; and
providing the DC signal to at least one of the RF-responsive transmitter and the part identifier.

71. The method of monitoring a material processing system as claimed in claim 70, wherein the method further comprises:
generating the DC signal using at least one of a battery, filter, a RF-to-DC converter, and a DC-to-DC converter.

72. The method of monitoring a material processing system as claimed in claim 58, the method further comprising:
transmitting an input signal using the SIA, the SIA comprising a transmitter, wherein the input signal comprises operational data; and
receiving the part ID data, wherein the SIA comprises a receiver configured to receive a response signal from the RF-responsive part identifier.

73. The method of monitoring a material processing system as claimed in claim 72, the method further comprising:
generating the part ID data; and
transmitting the part ID data, wherein the RF-responsive part identifier receives the input signal and uses the operational data to transmit the part ID data using the response signal.

74. The method of monitoring a material processing system as claimed in claim 58, the method further comprising:

transmitting an input signal using the SIA, the SIA comprising a transmitter, wherein the input signal comprises operational data;

receiving the input signal, wherein the RF-responsive part identifier comprises a receiver configured to receive the input signal and to obtain the operational data from the input signal;

generating the part ID data, wherein the RF-responsive part identifier comprises a part identifier configured to generate the part ID data;

transmitting the part ID data, wherein the RF-responsive part identifier comprises a transmitter configured to transmit the part ID data using a response signal; and receiving the part ID data, the SIA comprising a receiver configured to receive the response signal from at least one RF-responsive part identifier.

75. The method of monitoring a material processing system as claimed in claim 74, the method further comprising:

transmitting the input signal using the SIA when plasma is not being generated; and receiving the input signal, when plasma is not being generated.

76. The method of monitoring a material processing system as claimed in claim 74, the method further comprising:

generating the part ID data, when a process is being performed;

transmitting the response signal using the RF-responsive part identifier when plasma is not being generated; and receiving the response signal, when plasma is not being generated.

77. The method of monitoring a material processing system as claimed in claim 74, the method further comprising:

storing the part ID data, wherein the RF-responsive part identifier comprises a memory configured to store the part ID data.

78. The method of monitoring a material processing system as claimed in claim 74, the method further comprising:

providing a DC signal, wherein the RF-responsive part identifier comprises a power source configured to produce the DC signal and to provide the DC signal to at least one of the RF-responsive part identifier receiver and the RF-responsive part identifier transmitter.

79. The method of monitoring a material processing system as claimed in claim 78, the method further comprising:

providing a DC signal, wherein the RF-responsive part identifier comprises a power source configured to produce the DC signal by converting at least one plasma related frequency into the DC signal.

80. The method of monitoring a material processing system as claimed in claim 78, the method further comprising:

providing a DC signal, wherein the RF-responsive part identifier comprises a power source configured to produce the DC signal by converting at least one non-plasma related frequency into the DC signal.

81. The method of monitoring a material processing system as claimed in claim 78, the method further comprising:

providing a DC signal, wherein the RF-responsive part identifier comprises a power source configured to produce the DC signal by converting a portion of the input signal into the DC signal.

* * * * *